(12) United States Patent
DeGraw et al.

(10) Patent No.: US 8,629,063 B2
(45) Date of Patent: Jan. 14, 2014

(54) FORMING FEATURES ON A SUBSTRATE HAVING VARYING FEATURE DENSITIES

(75) Inventors: Danielle L. DeGraw, Hyde Park, NY (US); Candace A. Sullivan, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 13/155,776

(22) Filed: Jun. 8, 2011

(65) Prior Publication Data

US 2012/0313250 A1    Dec. 13, 2012

(51) Int. Cl.
*H01L 21/283* (2006.01)

(52) U.S. Cl.
USPC ........... 438/691; 438/692; 438/704; 438/712; 438/720

(58) Field of Classification Search
USPC .............................. 438/690–692; 134/1.2, 1.3
See application file for complete search history.

(56) References Cited

U.S. PATENT DOCUMENTS

| | | | |
|---|---|---|---|
| 4,931,410 A | | 6/1990 | Tokunaga et al. |
| 5,084,419 A | * | 1/1992 | Sakao ............................ 438/400 |
| 5,504,704 A | * | 4/1996 | Sato et al. ...................... 365/182 |
| 5,578,516 A | * | 11/1996 | Chou ............................. 438/253 |
| 5,663,101 A | | 9/1997 | Cronin |
| 5,773,360 A | | 6/1998 | Chang et al. |
| 5,828,288 A | * | 10/1998 | Jones et al. ...................... 338/20 |
| 5,873,948 A | * | 2/1999 | Kim ............................... 438/706 |
| 5,960,254 A | * | 9/1999 | Cronin ............................. 438/14 |
| 6,103,455 A | * | 8/2000 | Huang et al. ................... 430/313 |
| 6,221,775 B1 | * | 4/2001 | Ference et al. ................. 438/691 |
| 6,251,786 B1 | | 6/2001 | Zhou et al. |
| 6,277,753 B1 | * | 8/2001 | Mullee et al. .................. 438/692 |
| 6,331,487 B2 | * | 12/2001 | Koch ............................. 438/692 |
| 6,514,878 B2 | * | 2/2003 | Watatani ........................ 438/769 |
| 6,599,173 B1 | * | 7/2003 | Cruz et al. ........................ 451/41 |
| 6,939,796 B2 | | 9/2005 | Lohokare et al. |
| 7,026,246 B2 | * | 4/2006 | Yun ................................ 438/693 |
| 7,064,070 B2 | * | 6/2006 | Mullee et al. .................. 438/691 |
| 7,064,076 B2 | | 6/2006 | Kulkarni |
| 7,204,934 B1 | * | 4/2007 | Braly et al. ....................... 216/59 |
| 7,253,098 B2 | | 8/2007 | Chen et al. |
| 7,948,170 B2 | * | 5/2011 | Striakhilev et al. ............ 313/506 |
| 2002/0127844 A1 | * | 9/2002 | Grill et al. ...................... 438/622 |
| 2004/0248371 A1 | * | 12/2004 | Wang .............................. 438/330 |
| 2005/0158985 A1 | * | 7/2005 | Chen et al. ..................... 438/629 |
| 2009/0102016 A1 | * | 4/2009 | Gebreselasie et al. ......... 257/532 |

OTHER PUBLICATIONS

Davari et al., A New Planarization Technique, Using a Combination of RIE and CMP, IEEE International Electron Devices Meeting, 1989, IEDM '89, pp. 61-64.

Kulkarni et al., Application of Volatility Diagrams for Low Temperature, Dry Etching, and Planarization of Copper, J. Electrochem. Soc., 2002, vol. 149, Issue 11, pp. G620-G632.

Min et al., Reactive Ion Etching as Cleaning Method Post Chemical Mechanical Polishing for Phase Change Memory Device, Chinese Phys. Lett., 2008, vol. 25, pp. 762-764.

Kuo et al., Room-temperature copper etching based on a plasma-copper reaction, Applied Physics Lett., 2001, vol. 78, pp. 1002-1004.

* cited by examiner

*Primary Examiner* — Cheung Lee
*Assistant Examiner* — William Harriston
(74) *Attorney, Agent, or Firm* — Cantor Colburn LLP; Ian MacKinnon

(57) ABSTRACT

A method includes forming a cavity in a substrate, depositing a layer of conductive material in the cavity and over exposed portions of the substrate, removing portions of the conductive material to expose portions of the substrate using a planarizing process, and removing residual portions of the conductive material disposed on the substrate using a reactive ion etch (RIE) process.

18 Claims, 8 Drawing Sheets

US 8,629,063 B2

FORMING FEATURES ON A SUBSTRATE HAVING VARYING FEATURE DENSITIES

BACKGROUND

The present invention relates to forming features on a substrate, and more specifically, to methods for forming conductive features on a substrate.

Semiconductors and other devices are often formed on substrates such as silicon substrates. The devices are often connected using conductive features such as metallic contacts and conductive lines formed in or embedded in layers of materials formed on the substrate.

In this regard, a substrate may include a silicon or buried oxide layer and may include a variety of insulator oxide or nitride layers formed on the silicon or buried oxide layer. Cavities may be formed in the insulator layers that define the conductive features. The conductive features may be formed by depositing a conductive material in the cavities and over the exposed portions of the top layer of the substrate. A planarizing process such as chemical mechanical polishing (CMP) removes the conductive material from the top layer of the substrate, exposing the top layer of the substrate, and defining the conductive features.

SUMMARY

According to one embodiment of the present invention, a method includes forming a cavity in a substrate, depositing a layer of conductive material in the cavity and over exposed portions of the substrate, removing portions of the conductive material to expose portions of the substrate using a planarizing process, and removing residual portions of the conductive material disposed on the substrate using a reactive ion etch (RIE) process.

According to another embodiment of the present invention, a method includes forming a plurality of cavities in a first region of a substrate, depositing a layer of conductive material in the plurality of cavities in the first region of the substrate and over exposed portions of a second region of the substrate, removing portions of the conductive material to expose portions of the first region and the second region of the substrate using a planarizing process, and removing residual portions of the conductive material disposed on the second region of the substrate using a reactive ion etch (RIE) process.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
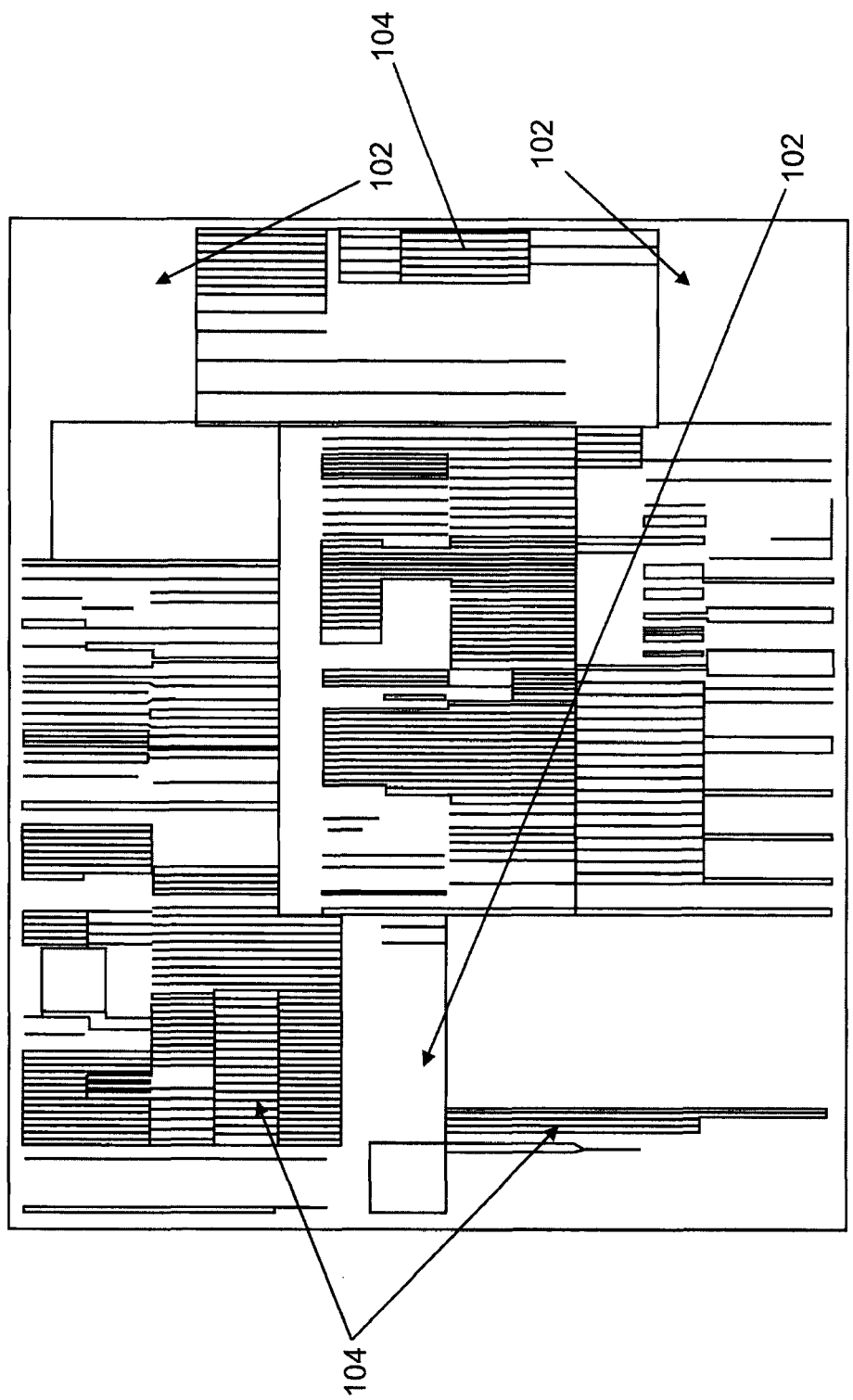
FIG. 1 illustrates a top view of a reticle field that includes patterned features that are formed on a substrate.

FIG. 1 illustrates a top view of a reticle field that includes patterned features that are formed on a substrate in the densely patterned regions 104 (i.e., areas of the substrate having closely arranged patterned features). The less dense regions 102 include areas of the substrate that do not include patterned features or include a relatively low density of patterned features. In the illustrated embodiment, some of the patterned features will become conductive features such as, for example, conductive lines or contacts embedded in the substrate. The conductive features may be formed by, for example, forming cavities in layers of the substrate that are filled with a conductive material such as, for example, copper or another conductive material using a deposition process such as chemical vapor deposition (CVD) or plasma enhanced chemical vapor deposition (PECVD). The deposition process results in the deposition of the conductive material in the cavities and over exposed portions of the substrate. Following the deposition process, a planarizing process such as, for example, chemical mechanical polishing (CMP) may be used to remove the conductive material from the exposed portions of the substrate resulting in conductive features formed in the cavities of the substrate.

The CMP process typically does not remove the conductive material uniformly. Rather, the CMP process tends to remove conductive material in the densely patterned regions 104 at a faster rate than in the less dense regions 102. Thus, the CMP process may leave undesirable residual conductive material in the less dense regions 102. The undesirable residual conductive material in the less dense regions 102 may cause problematic electrical shorts when additional features such as, for example, conductive pads are formed in the less dense regions 102. The methods described below offer processes for removing the undesirable residual conductive material in the less dense regions 102.

Figure 2:
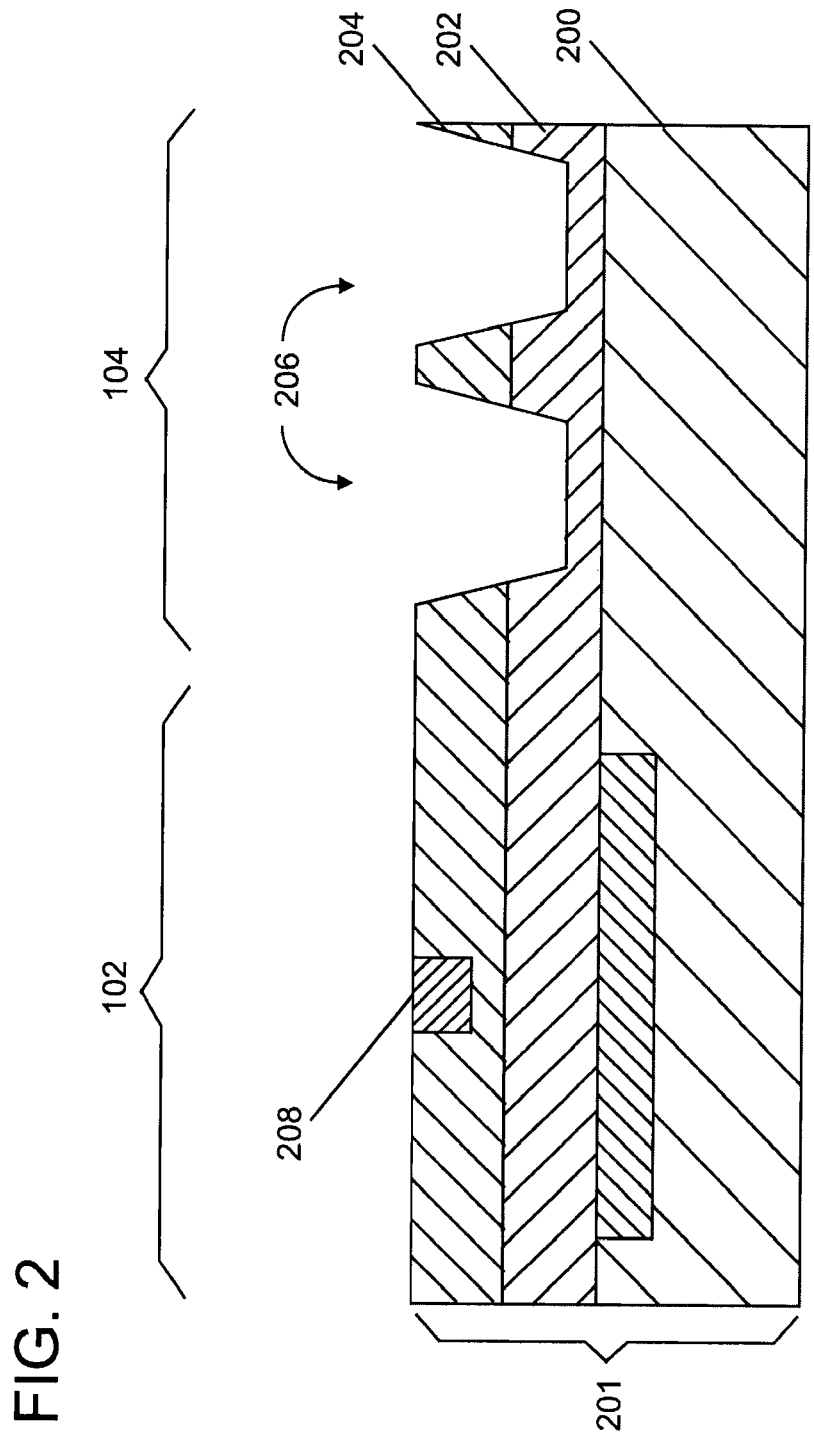
FIG. 2 illustrates a side cut-away view of an exemplary embodiment of a portion of a wafer or chip.

FIG. 2 illustrates a side cut-away view of an exemplary embodiment of a portion of a wafer or chip that may be patterned similarly to the reticle field described above in FIG. 1. In the illustrated embodiment, a substrate 201 includes a silicon or a silicon on insulator layer 200, an insulator layer 202 that may include, for example, an oxide material, and a nitride layer 204. Alternate embodiments may include any type of suitable substrate material or materials that may be formed uniformly or in layers of any number or combination of materials. In the illustrated embodiment, cavities 206 are formed in the insulator layer 202 and the nitride layer 204 of the substrate 201. The cavities 206 may be formed by any suitable process such as, for example, a lithographic patterning and etching process that removes portions of the substrate 201 to define the cavities 206. The cavities 206 will define conductive features (described below), and are located in the densely patterned region 104 while a less densely or unpatterned region 102 is located adjacent to the densely patterned region 102. The illustrated exemplary embodiment includes a photolithographic alignment mark 208 located in the region 102. The photolithographic alignment mark 208 may be used to align photolithographic masks in subsequent photolithographic patterning processes.

Figure 3:
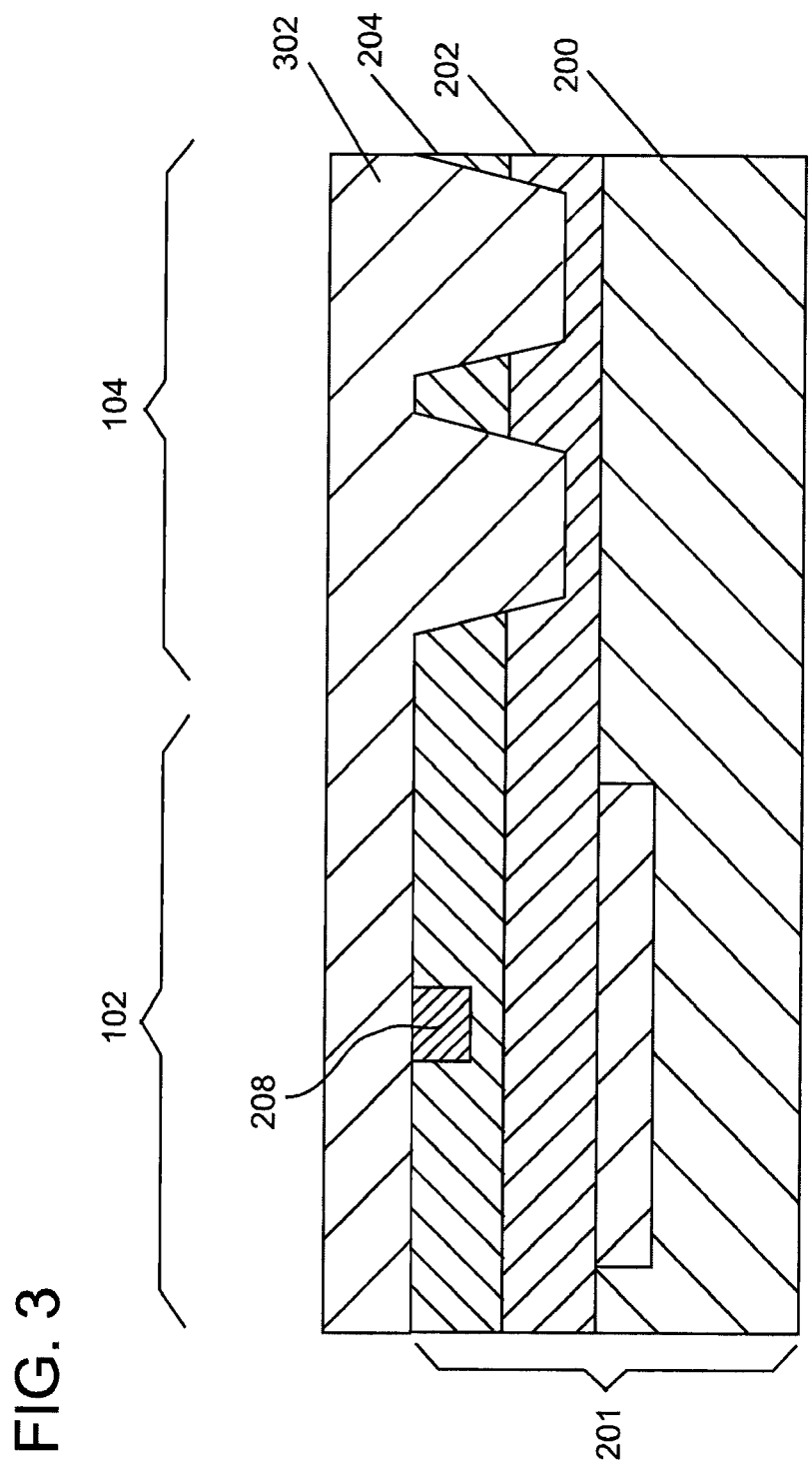
FIG. 3 illustrates the deposition of a conductive material in cavities and over the exposed portions of the substrate.

FIG. 3 illustrates the deposition of a conductive material 302 in the cavities 206 and over the exposed portions of the substrate 201. The conductive material 302 may include, for example, copper or another conductive material such as aluminum. The conductive material 302 may be deposited using for example, a chemical vapor deposition (CVD) or plasma enhanced chemical vapor deposition (PECVD) process.

Figure 4:
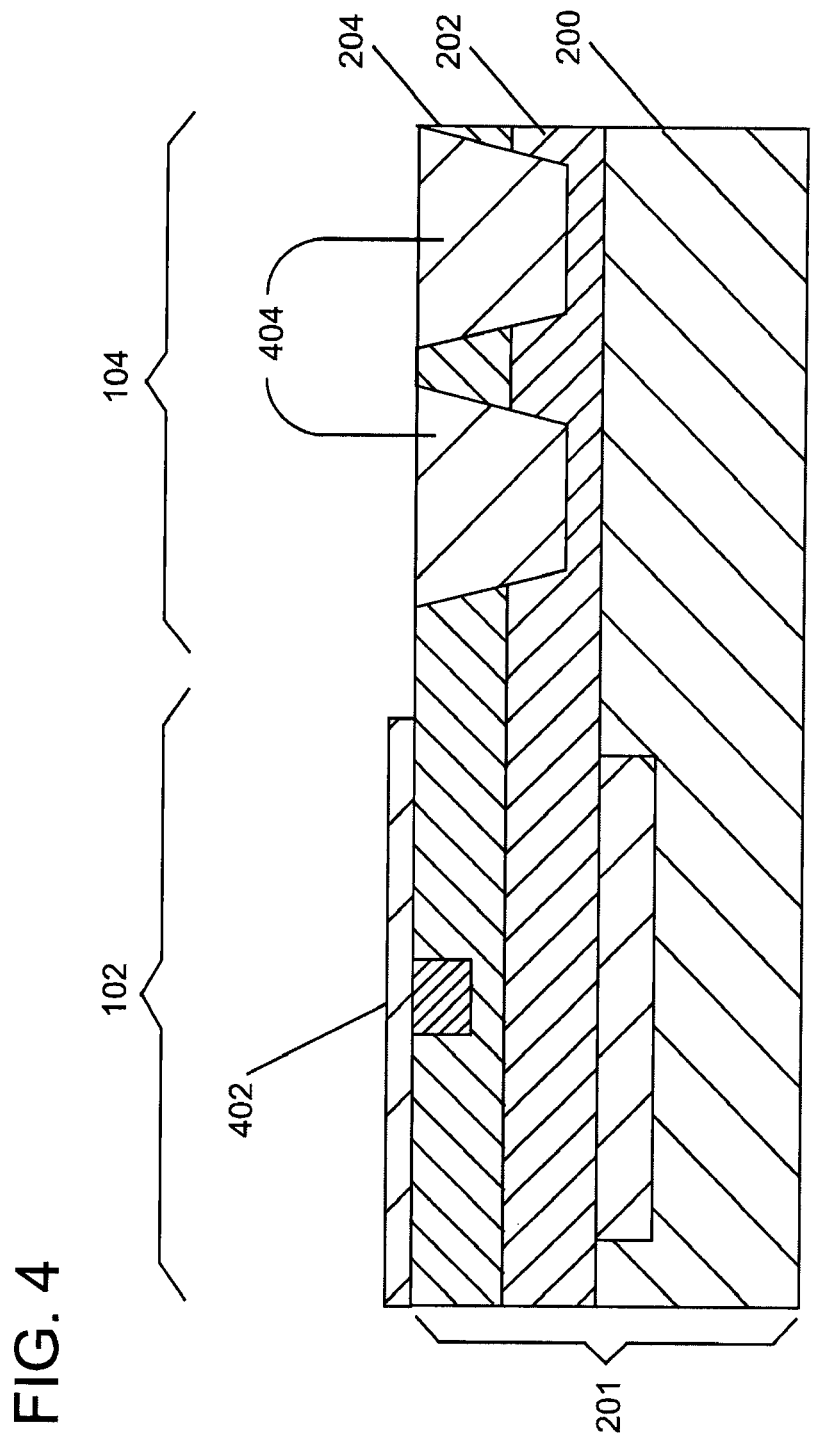
FIG. 4 illustrates the resultant structure following the removal of portions of the conductive material.

FIG. 4 illustrates the resultant structure following the removal of portions of the conductive material 302 (of FIG. 3) using a CMP process. The CMP process planarizes the arrangement to expose portions of the substrate 201 and define conductive features 404. The CMP process has removed the conductive material 302 in the region 104, but has left residual conductive material 402 in the region 102. The residual conductive material 402 is caused by the tendency of the CMP process to remove the conductive material 302 in the densely patterned region 104 at a greater rate than the removal of the conductive material 302 in the less densely patterned region 102.

Figure 5:
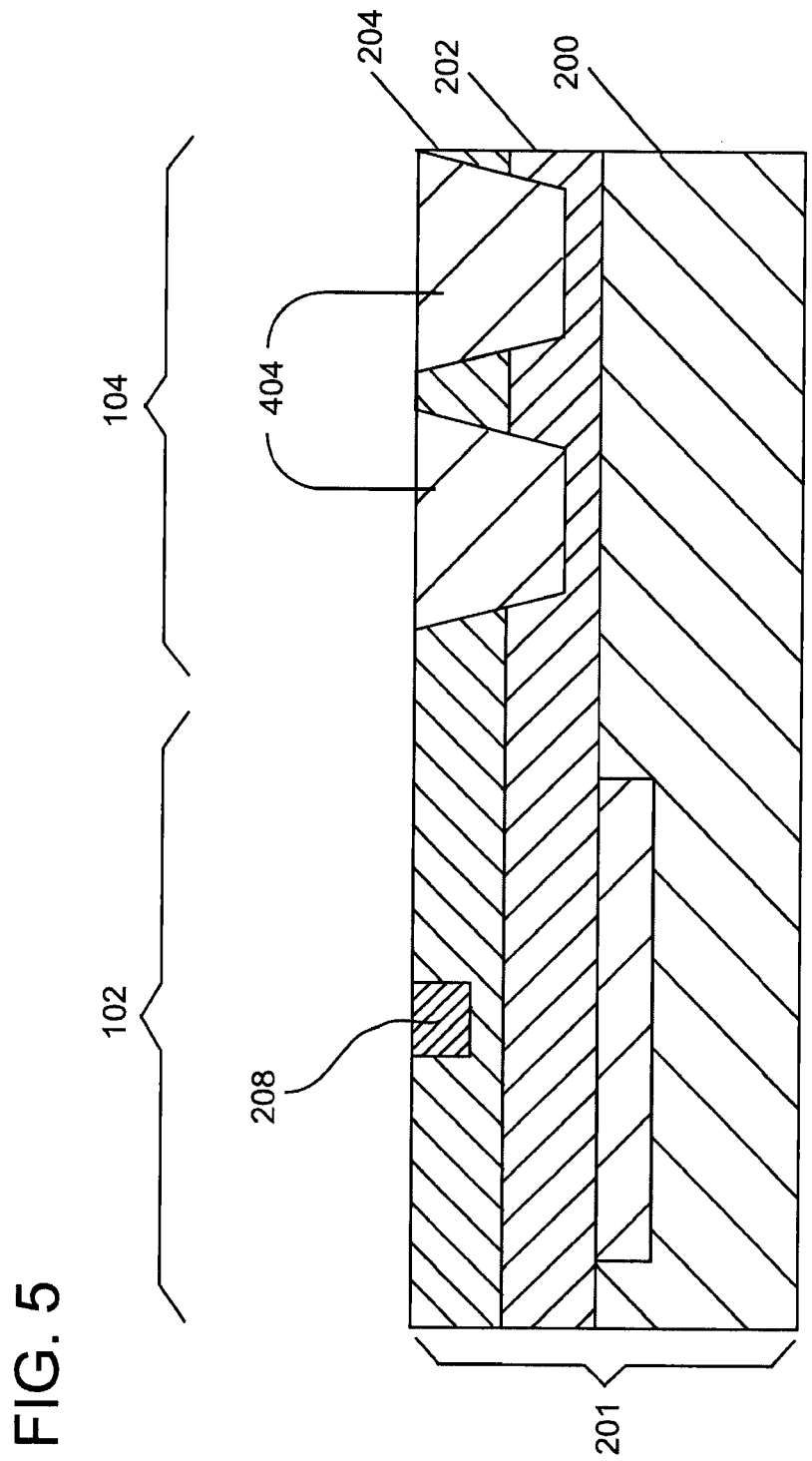
FIG. 5 illustrates the resultant structure following a reactive ion etch process.

FIG. 5 illustrates the resultant structure following a post-CMP, reactive ion etch (RIE) process that removes the residual conductive material 402 (of FIG. 4) from the substrate 201. The RIE process used in the illustrated embodiments produces a lag effect that tends to remove conductive material having a smaller exposed surface area such as the conductive material in the conductive features 404 at a slower rate than the conductive material having a greater exposed surface area such as the residual conductive features 404. Thus, an RIE process that induces RIE lag is performed to remove the residual conductive material 402 without appreciably removing portions of the conductive features 404. The lag in the RIE process may be caused by the depletion of etching ions and/or inhibiting neutrals during their passage into the conductive features 404. The RIE process uses for example, SF6/O2 chemistry, CCl2F2/O2 chemistry, or any other RIE chemistry that results in an appropriate lag effect. The removal of the residual conductive material 402 exposes the photolithographic alignment mark 208.

The removal of the residual conductive material 402 (of FIG. 4) exposes the less densely patterned regions 102 of the substrate 201 such that lithographic alignment marks that may be present in the regions 102 are visible for the alignment of subsequent lithographic masks. The exposure of the less densely patterned regions 102 also allows additional features such as, for example, conductive pads (described below), to be formed in the less densely patterned regions 102 without causing undesirable electrical shorts between the conductive pads and the conductive features 404.

Figure 6:
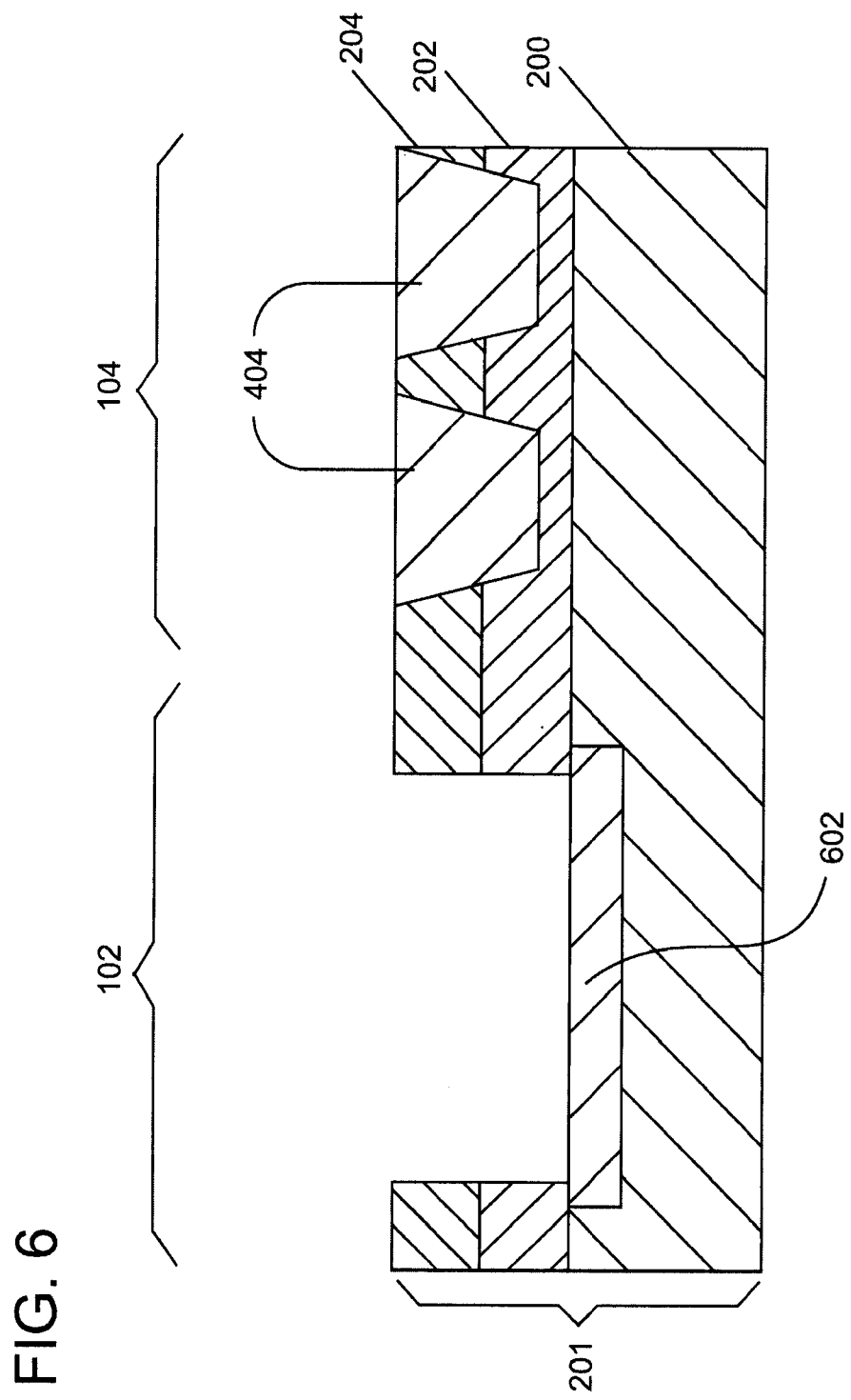
FIG. 6 illustrates the resultant structure following the removal of portions of the substrate to expose a conductive region.

In this regard, FIG. 6 illustrates the resultant structure following the removal of portions of the substrate 201 to expose a conductive region 602. The portions of the substrate 201 are removed using a patterning and etching process that removes portions of the insulator layer 202 and the nitride layer 204.

Figure 7:
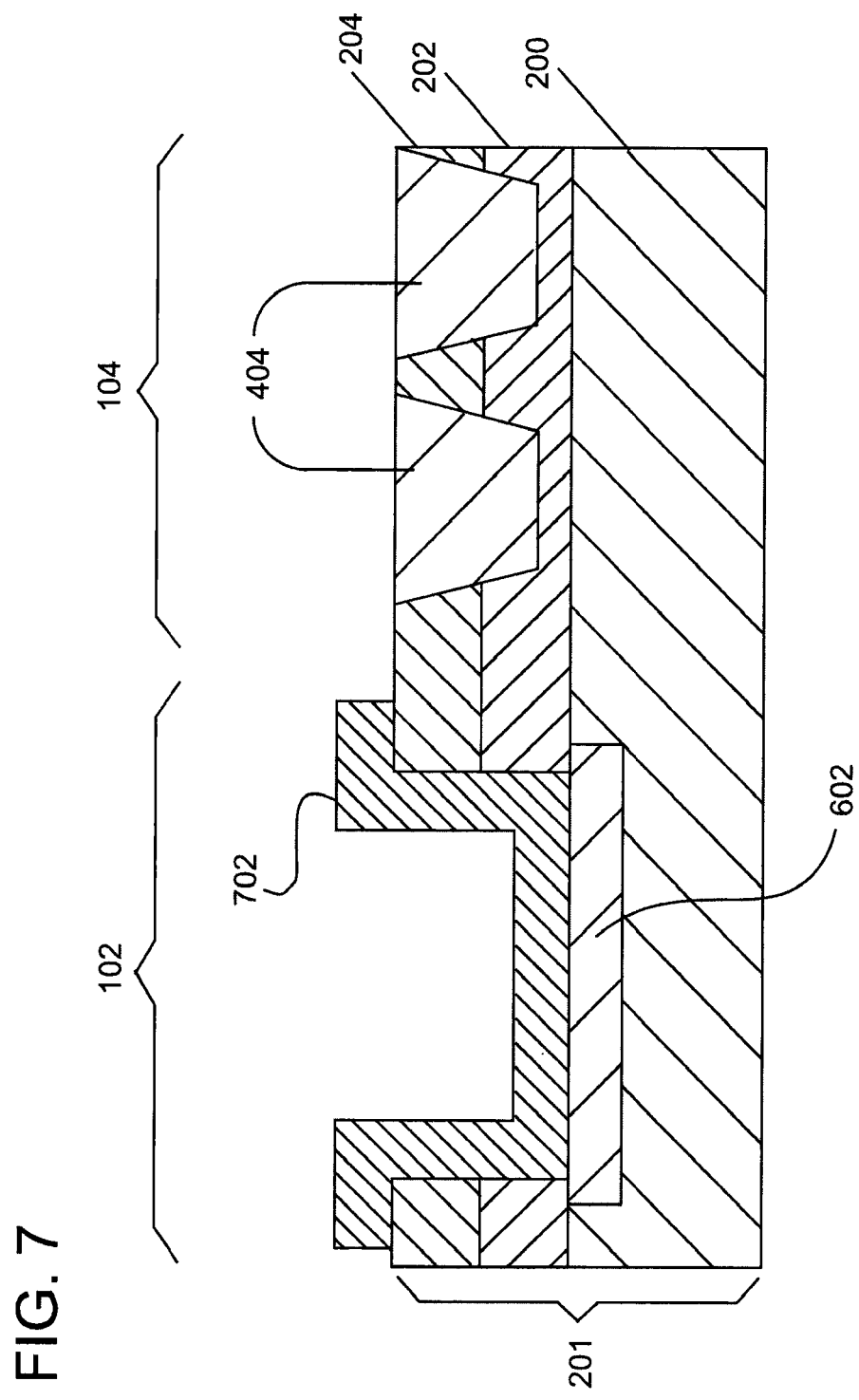
FIG. 7 illustrates the resultant structure following the deposition and patterning of a conductive pad.

FIG. 7 illustrates the resultant structure following the deposition and patterning of a conductive pad 702 that is deposited over portions of the conductive region 602 and the substrate 201. The conductive pad 702 may be formed from a conductive material such as, for example, aluminum. The conductive pad 702 may formed by, for example, a deposition of conductive material over the exposed portions of the substrate 201, the conductive region 602, and the conductive features 404. A lithographic patterning and selective etching process may be used to expose portions of the substrate 201 and the conductive features 404, and to define the conductive pad 702.

Figure 8:
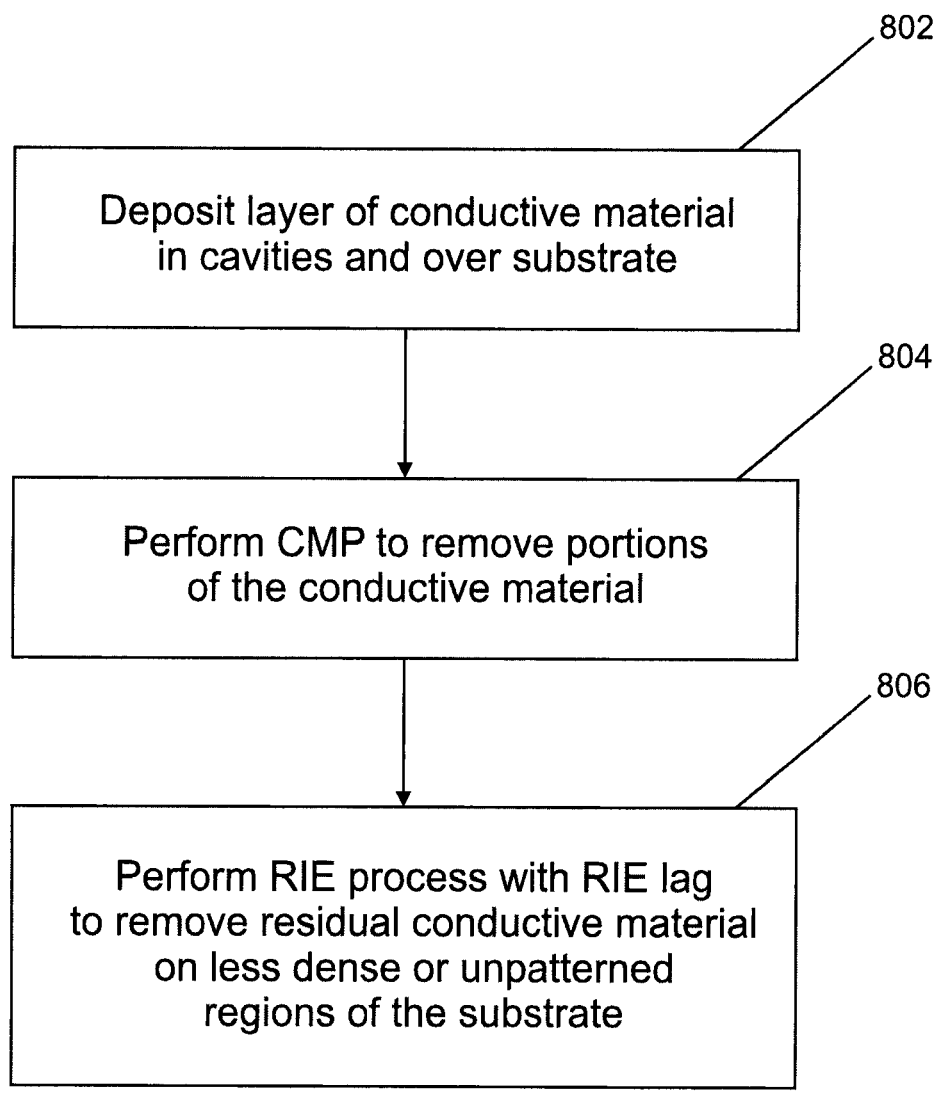
FIG. 8 illustrates a block diagram of an exemplary method.

FIG. 8 illustrates a block diagram of an exemplary method similar to the method described above. In this regard, in block 802 a layer of conductive material is deposited over a substrate and in patterned cavities defined by the substrate. In block 804 a CMP process is performed that removes portions of the layer of conductive material leaving residual conductive material in less dense or unpatterned regions of the substrate. In block 806, a RIE process that induces RIE lag is performed that removes the residual conductive material without appreciably removing the conductive material deposed in the cavities. Following the RIE process in block 806 any suitable or desired processes may be performed to form other features or elements on the substrate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:
1. A method comprising:
forming at least one cavity in a substrate having a first region and a second region, the first region having a greater number of patterned cavities formed therein than the second region;
depositing a layer of conductive material in the cavity included in the first region and over exposed portions of the substrate included in the second region;
removing portions of the conductive material to expose portions of the substrate using a planarizing process; and removing residual portions of the conductive material disposed on the substrate in the second region using a reactive ion etch (RIE) process without removing remaining portions of the conductive material disposed in the patterned cavities of the first region, wherein the RIE process induces a lag based on a surface area difference of the conductive material disposed in the patterned cavities with respect to the residual portions of the conductive material such that the residual portions of the conductive material are removed at a faster rate than the conductive material disposed in the patterned cavities.

2. The method of claim 1, wherein the planarizing process includes a chemical mechanical polishing (CMP) process.

3. The method of claim 1, wherein the method further comprises:

removing portions of the second region of the substrate to expose a conductive region disposed in the second region; and depositing a second layer of conductive material over the conductive region.

4. The method of claim 1, wherein the substrate includes at least one insulator layer disposed on a layer of silicon material.

5. The method of claim 1, wherein the RIE process uses a SF6/O2 chemistry.

6. The method of claim 1, wherein the RIE process uses a CCl2F2/O2 chemistry.

7. The method of claim 1, wherein the layer of conductive material includes copper.

8. The method of claim 1, wherein the cavity is formed using a lithographic patterning and etching process.

9. The method of claim 1, wherein the removing residual portions of the conductive material disposed in the second region of the substrate using a reactive ion etch (RIE) process exposes a lithographic alignment mark disposed on the substrate.

10. A conductive feature formed by the process of claim 1.

11. A method comprising:

forming a plurality of cavities in a first region of a substrate;

depositing a layer of conductive material in the plurality of cavities in the first region of the substrate and over exposed portions of a second region of the substrate, the first region having a greater number of patterned cavities formed therein than the second region;

removing portions of the conductive material to expose portions of the first region and the second region of the substrate using a planarizing process; and removing residual portions of the conductive material disposed on the second region of the substrate using a reactive ion etch (RIE) process, without removing remaining portions of the conductive material disposed in the patterned cavities of the first region, wherein the RIE process induces a lag based on a surface area difference of the conductive material disposed in the patterned cavities with respect to the residual portions of the conductive material such that the residual portions of the conductive material are removed at a faster rate than the conductive material disposed in the patterned cavities.

12. The method of claim 11, wherein the planarizing process includes a chemical mechanical polishing (CMP) process.

13. The method of claim 11, wherein the method further comprises:

removing portions of the second region of the substrate to expose a conductive region; and depositing a second layer of conductive material over the conductive region.

14. The method of claim 11, wherein the substrate includes at least one insulator layer disposed on a layer of silicon material.

15. The method of claim 11, wherein the RIE process uses a SF6/O2 chemistry.

16. The method of claim 11, wherein the RIE process uses a CCl2F2/O2 chemistry.

17. The method of claim 11, wherein the second region of the substrate includes a photolithographic alignment mark.

18. The method of claim 17, wherein the removing residual portions of the conductive material disposed in the second region of the substrate using the reactive ion etch (RIE) process exposes the lithographic alignment mark.

* * * * *